(12) United States Patent
Stephens, IV

(10) Patent No.: US 7,305,016 B2
(45) Date of Patent: Dec. 4, 2007

(54) LASER DIODE PACKAGE WITH AN INTERNAL FLUID COOLING CHANNEL

(75) Inventor: Edward Franklin Stephens, IV, Golden Eagle, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 443 days.

(21) Appl. No.: 11/077,466

(22) Filed: Mar. 10, 2005

(65) Prior Publication Data

US 2006/0203866 A1 Sep. 14, 2006

(51) Int. Cl.
*H01S 3/04* (2006.01)

(52) U.S. Cl. .......................................... 372/35; 372/34
(58) Field of Classification Search ................. 372/34, 372/35, 61, 65, 36
See application file for complete search history.

(56) References Cited

U.S. PATENT DOCUMENTS 3,303,432 A 2/1967 Garfinkel et al.

(Continued)

FOREIGN PATENT DOCUMENTS

| EP | 0 458 469 A1 | 4/1991 |
|---|---|---|
| EP | 0 550 996 B1 | 12/1992 |
| EP | 0 634 822 B1 | 7/1994 |
| EP | 0 805 527 B1 | 4/1997 |
| EP | 0 833 419 A1 | 9/1997 |
| EP | 1513194 | 3/2005 |
| JP | 55-65450 | 5/1980 |
| JP | 60-211992 | 10/1985 |

OTHER PUBLICATIONS

Ahearn, W.E., Thermal Spacer For Room Temperature Close-Packed GaAs Laser Arrays, IBM Technical Disclosure Bulleting, vol. 12, No. 12, p. 2311, May 1970.

(Continued)

*Primary Examiner*—Minsun Oh Harvey
*Assistant Examiner*—Tuan N. Nguyen
(74) *Attorney, Agent, or Firm*—Nixon Peabody LLP.

(57) ABSTRACT

A laser diode assembly has a laser diode. The laser diode has an emitting surface and a reflective surface opposing the emitting surface. The laser diode has first and second side surfaces between the emitting and reflective surfaces. A first electrically-insulating heat sink is attached to the first side surface of the laser diode via a first solder bond, and the first heat sink has a first cooling channel. A second electrically-insulating heat sink is attached to the second side surface of the laser diode via a second solder bond, and the second electrically-insulating heat sink has a second cooling channel. A substrate has a top side and a bottom side, and the top side being in communication with a first bottom side of the first electrically-insulating heat sink and a second bottom side of the second electrically-insulating heat sink. The substrate has a flow channel system for passing a coolant to the first cooling channel and the second cooling channel. A metallization layer is attached to the first electrically-insulating heat sink and the second electrically-insulating heat sink. The metallization layer is electrically coupled to the laser diode and conducts electrical current to the laser diode. The metallization layer is isolated from the coolant.

25 Claims, 3 Drawing Sheets

U.S. PATENT DOCUMENTS

| | | | |
|---|---|---|---|
| 3,339,151 A | 8/1967 | Smith | |
| 3,590,248 A | 6/1971 | Chatterton, Jr. | |
| 3,654,497 A | 4/1972 | Dyment et al. | |
| 3,683,296 A | 8/1972 | Scalise | |
| 3,771,031 A | 11/1973 | Kay | |
| 3,802,967 A | 4/1974 | Ladany et al. | |
| 3,896,473 A | 7/1975 | DiLorenzo et al. | |
| 3,958,263 A | 5/1976 | Panish et al. | |
| 3,962,655 A | 6/1976 | Selway et al. | |
| 4,057,101 A | 11/1977 | Ruka et al. | |
| 4,092,614 A | 5/1978 | Sakuma et al. | |
| 4,219,072 A | 8/1980 | Barlow | |
| 4,228,406 A | 10/1980 | Lewis et al. | |
| 4,233,567 A | 11/1980 | Chernoch | |
| 4,315,225 A | 2/1982 | Allen, Jr. et al. | |
| 4,383,270 A | 5/1983 | Schelhorn | |
| 4,393,393 A | 7/1983 | Allen, Jr. et al. | |
| 4,415,234 A | 11/1983 | Meyers | |
| 4,454,602 A | 6/1984 | Smith | |
| 4,573,067 A | 2/1986 | Tuckermann et al. | |
| 4,617,585 A | 10/1986 | Yasui | |
| 4,673,030 A | 6/1987 | Basiulis | |
| 4,709,750 A | 12/1987 | White | |
| 4,716,568 A | 12/1987 | Scifres et al. | |
| 4,730,324 A | 3/1988 | Azad | |
| 4,782,222 A | 11/1988 | Ragle et al. | |
| 4,831,629 A | 5/1989 | Paoli et al. | |
| 4,837,768 A | 6/1989 | Schmid | |
| 4,847,848 A | 7/1989 | Inoue et al. | |
| 4,852,109 A | 7/1989 | Kuchar | |
| 4,877,641 A | 10/1989 | Dory | |
| 4,881,233 A | 11/1989 | von Arb et al. | |
| 4,881,237 A | 11/1989 | Donnelly | |
| 4,899,204 A | 2/1990 | Rosen et al. | |
| 4,901,330 A | 2/1990 | Wolfram et al. | |
| 4,949,346 A | 8/1990 | Kuper et al. | |
| 4,963,741 A | 10/1990 | McMullin | |
| 4,975,923 A | 12/1990 | Buus et al. | |
| 5,001,355 A | 3/1991 | Rosen et al. | |
| 5,005,640 A | 4/1991 | Lapinski et al. | |
| 5,022,042 A | 6/1991 | Bradley | |
| 5,031,187 A | 7/1991 | Orenstein et al. | |
| 5,040,187 A | 8/1991 | Karpinski | |
| 5,073,838 A | 12/1991 | Ames | |
| 5,076,348 A | 12/1991 | Bluege | |
| 5,084,888 A | 1/1992 | Tajima et al. | |
| 5,099,214 A | 3/1992 | Rosen et al. | |
| 5,099,488 A | 3/1992 | Ahrabi et al. | |
| 5,105,429 A | 4/1992 | Mundinger et al. | |
| 5,115,445 A | 5/1992 | Mooradian | |
| 5,128,951 A | 7/1992 | Karpinski | |
| 5,156,999 A | 10/1992 | Lee | |
| 5,163,064 A | 11/1992 | Kim et al. | |
| 5,212,699 A | 5/1993 | Masuko et al. | |
| 5,216,263 A | 6/1993 | Paoli | |
| 5,216,688 A | 6/1993 | Kortz et al. | |
| 5,220,954 A | 6/1993 | Longardner et al. | |
| 5,253,260 A | 10/1993 | Palombo | |
| 5,265,113 A | 11/1993 | Halldorsson et al. | |
| 5,284,790 A | 2/1994 | Karpinski | |
| 5,287,375 A | 2/1994 | Fujimoto | |
| 5,305,344 A | 4/1994 | Patel | |
| 5,311,535 A | 5/1994 | Karpinski | |
| 5,311,536 A | 5/1994 | Paoli et al. | |
| 5,315,154 A | 5/1994 | Elwell | |
| 5,323,411 A | 6/1994 | Shirasaka et al. | |
| 5,325,384 A | 6/1994 | Herb et al. | |
| 5,327,442 A * | 7/1994 | Yarborough et al. | 372/35 |
| 5,337,325 A | 8/1994 | Hwang | |
| 5,351,259 A | 9/1994 | Ishimori et al. | |
| 5,388,755 A | 2/1995 | Baxter | |
| 5,394,426 A | 2/1995 | Joslin | |
| 5,394,427 A | 2/1995 | McMinn et al. | |
| 5,402,436 A | 3/1995 | Paoli | |
| 5,402,437 A | 3/1995 | Mooradian | |
| 5,438,580 A | 8/1995 | Patel et al. | |
| 5,485,482 A | 1/1996 | Selker et al. | |
| 5,520,244 A | 5/1996 | Mundinger et al. | |
| 5,526,373 A | 6/1996 | Karpinski | |
| 5,548,605 A * | 8/1996 | Benett et al. | 372/36 |
| 5,663,979 A | 9/1997 | Marshall | |
| 5,734,672 A | 3/1998 | McMinn et al. | |
| 5,764,675 A | 6/1998 | Juhala | |
| 5,834,840 A | 11/1998 | Robbins et al. | |
| 5,835,518 A | 11/1998 | Mundinger et al. | |
| 5,898,211 A | 4/1999 | Marshall et al. | |
| 5,985,684 A | 11/1999 | Marshall et al. | |
| 5,987,043 A | 11/1999 | Brown et al. | |
| 6,091,746 A * | 7/2000 | LeGarrec et al. | 372/35 |
| 6,307,871 B1 | 10/2001 | Heberle | |
| 6,310,900 B1 | 10/2001 | Stephens et al. | |
| 6,351,478 B1 | 2/2002 | Heberle | |
| 6,352,873 B1 | 3/2002 | Hoden | |
| 6,397,618 B1 | 6/2002 | Chu et al. | |
| 6,421,364 B2 * | 7/2002 | Lubrano | 372/61 |
| 6,570,895 B2 | 5/2003 | Heberle | |
| 6,636,538 B1 | 10/2003 | Stephens | |
| 6,650,680 B2 * | 11/2003 | Zeller | 372/87 |
| 6,845,110 B2 * | 1/2005 | Gibson | 372/35 |
| 2002/0018498 A1 | 2/2002 | Heberle | |
| 2002/0110165 A1 | 8/2002 | Filgas | 372/36 |
| 2004/0182548 A1 | 9/2004 | Lovette et al. | 165/103 |

FOREIGN PATENT DOCUMENTS

| | | |
|---|---|---|
| JP | 01123493 A | 5/1989 |
| JP | 02281782 | 11/1990 |
| JP | 03-6875 | 1/1991 |
| JP | 03016290 A | 1/1991 |
| JP | 3269325 | 3/1991 |
| JP | 04359207 | 6/1991 |
| JP | 04023381 | 1/1992 |
| JP | 06-13717 | 1/1993 |
| WO | 96/28846 | 9/1996 |
| WO | WO 03075421 | 9/2003 |

OTHER PUBLICATIONS

Thomson CSF Semiconducteurs Specifiques, Package Specification (schematic), p. 3 (one page). Date unknown.

Mundinger, D. High Average Power Edge Emitting Laser Diode Arrays on Silicon Microchannel Coolers, Nov. 19, 1990.

IBM Corp. "Heat Sink Assembly for Tab-Mounted Devices," IBM Technical Disclosure Bulletin, vol. 31, No. 6, pp. 372-373, Nov. 1988.

IBM Corp. "Circuit Module Cooling With Multiple Pistons Contacting A Heat Spreader/Electrical Buffer Plate In Contact With Chip," IBM Technical Disclosure Bulletin, vol. 31, No. 12, pp. 5-7, May 1989.

Endriz, John G. "High Power Diode Laser Arrays," IEEE Journal of Quantum Electronics, No. 4, pp. 952-965, Apr. 1992.

Coherent Laser Group, Laser Diodes and Bars (article) (5 pages).

* cited by examiner

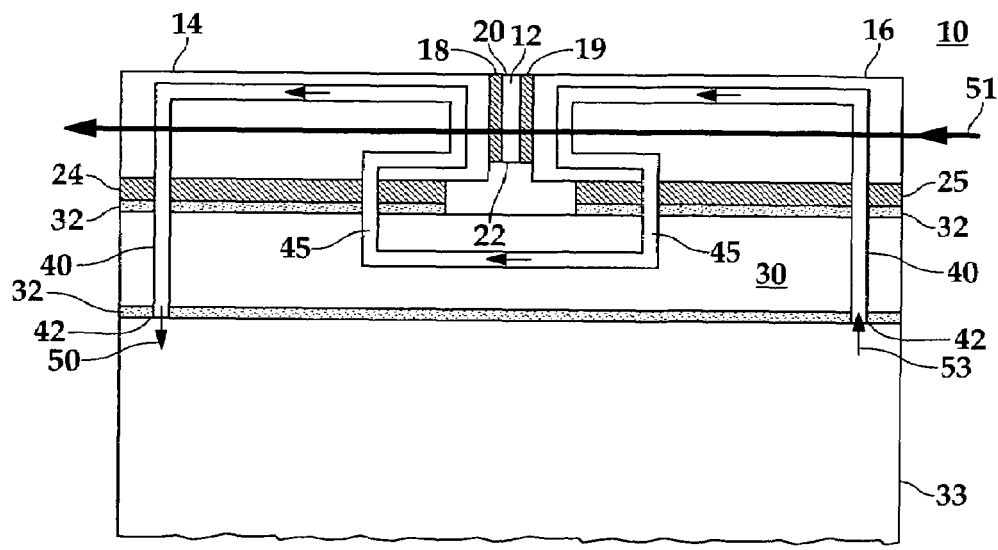
Fig.1
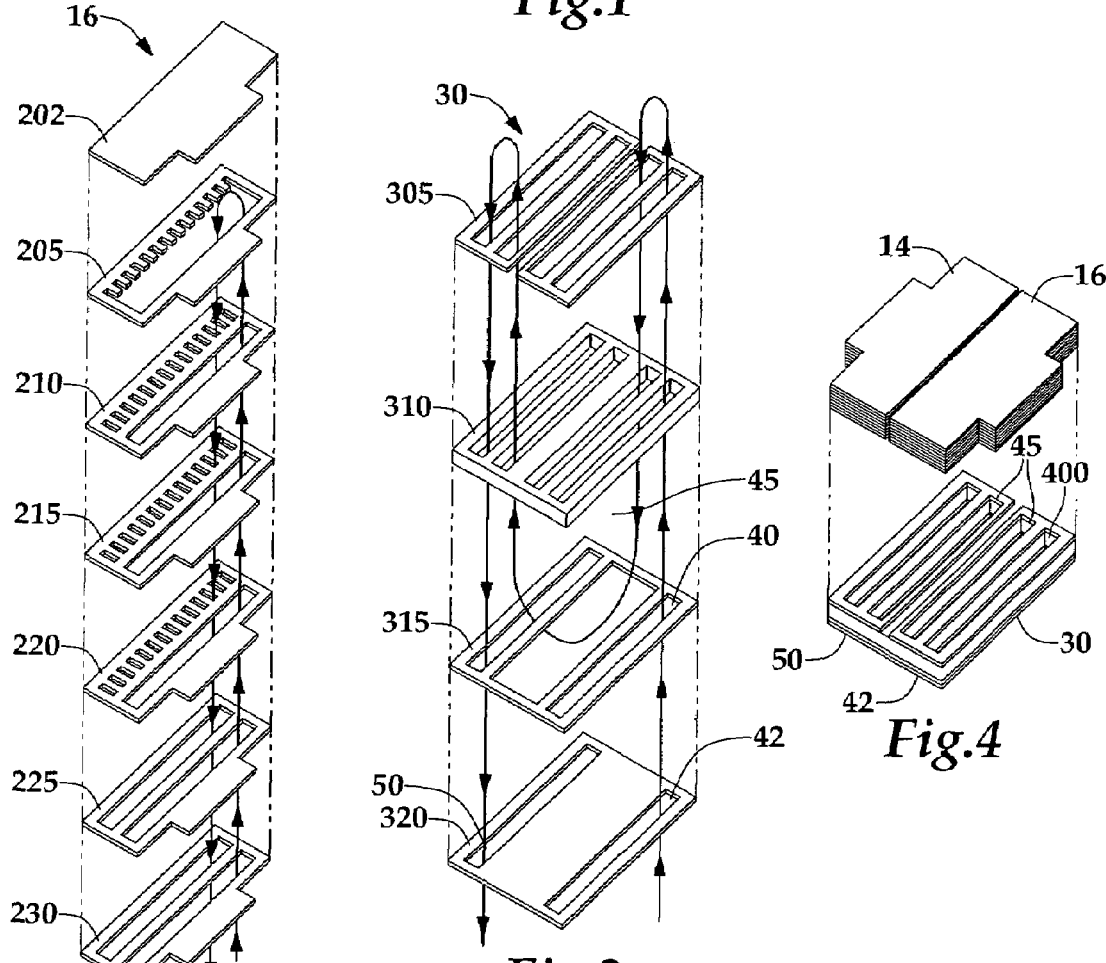
Fig.2
Fig.3
Fig.4

LASER DIODE PACKAGE WITH AN INTERNAL FLUID COOLING CHANNEL

FIELD OF THE INVENTION

The present invention relates generally to laser diodes and, in particular, to a cooling mechanism for a laser diode package that provides improved heat dissipation through use of macrochannel cooling channels housed within end blocks of the laser diode package.

BACKGROUND OF THE INVENTION

Semiconductor laser diodes have numerous advantages. They are small and the widths of their active regions are typically a submicron to a few microns and their heights are usually no more than a fraction of a millimeter. The length of their active regions is typically less than about a millimeter. The internal reflective surfaces, which produce emission in one direction, are formed by cleaving the substrate from which the laser diodes are produced and, thus, have high mechanical stability.

High efficiencies are possible with semiconductor laser diodes with some pulsed junction laser diodes having external quantum efficiencies near 50%. Semiconductor laser diodes produce radiation at wavelengths from about 20 to about 0.7 microns depending on the semiconductor alloy that is used. For example, laser diodes made of gallium arsenide with aluminum doping (AlGaAs) emit radiation at approximately 0.8 microns (~800 nm) which is near the absorption spectrum of common solid state laser rods and slabs made from Neodymium-doped, Yttrum-Aluminum Garnet (Nd:YAG), and other crystals and glasses. Thus, semiconductor laser diodes can be used as the optical pumping source for larger, solid state laser systems.

Universal utilization of semiconductor laser diodes has been restricted by thermally related problems. These problems are associated with the large heat dissipation per unit area of the laser diodes which results in elevated junction temperatures and stresses induced by thermal cycling. Laser diode efficiency and the service life of the laser diode are decreased as the operating temperature in the junction increases.

Furthermore, the emitted wavelength of a laser diode is a function of its junction temperature. Thus, when a specific output wavelength is desired, maintaining a constant junction temperature is essential. For example, AlGaAs laser diodes that are used to pump an Nd:YAG rod or slab should emit radiation at about 808 nm since this is the wavelength at which optimum energy absorption exists in the Nd:YAG. However, for every 3.5° C. to 4.0° C. deviation in the junction temperature of the AlGaAs laser diode, the wavelength shifts 1 nm. Accordingly, controlling the junction temperature and, thus, properly dissipating the heat is critical.

When solid state laser rods or slabs are pumped by laser diodes, dissipation of the heat becomes more problematic since it becomes necessary to densely pack a plurality of individual diodes into arrays which generate the required amounts of input power for the larger, solid state laser rod or slab. However, when the packing density of the individual laser diodes is increased, the space available for extraction of heat from the individual laser diodes decreases. This aggravates the problem of heat extraction from the arrays of individual diodes.

Laser diode systems must therefore utilize an effective heat transfer mechanism to operate as efficiently as possible.

One of the current laser diode systems utilizes a pin fin heat exchanger though which cooling water flows and absorbs the heat. Specifically, the laser diode system has a laser diode bar soldered between two metallic end-blocks. The end-bocks are themselves soldered onto a partially metallized substrate. This package is known as an array submodule. The function of this package is to extract heat from the laser diode bar and allow the connection of electrical hookups. Before use, the package is soldered onto a water-cooled heat exchanger. The package generally pulls heat away from both sides of the laser diode bar via the end blocks, and the heat travels down to the pin fin heat exchanger where the heat is carried away by coolant water.

However, a disadvantage of this arrangement is the distance between the heat source of the laser and the water coolant. This distance can cause the package to run at elevated temperatures, e.g., when the laser diode bar is operated above 20 Watts. It also contributes to poor performance when operated in an ON/OFF cycled mode.

Another type of cooling system for a laser diode package utilizes macrochannel coolers. These laser diode packages are small, e.g., 1 mm thick, and have small water channels running though them. The water channels pass close to a bottom side of the heat source (i.e., the laser diode bar), allowing for efficient thermal transfer. However, the macrochannel coolers typically remove heat from only one side of the laser diode bar.

When the macrochannel coolers are used, electrical current and water coolant reside in the same physical space. Consequently, the coolant water must be deionized. However, the use of deionized water requires all parts that are exposed to the water supply be either glass, plastic, stainless steel, or gold-plated. Parts which are not made of these materials usually deteriorate quickly and can cause severe corrosion problems.

Macrochannel coolers are made from a stack of thin copper sheets diffusion-bonded together in multiple layers. Each layer is photoetched so that, after diffusion bonding with other layers, small channels are formed allowing coolant passage through an area underneath the laser diode. However, the macrochannel coolers are relatively large and expensive to make, due to the limitation on the materials of which they are formed. The present invention is directed to satisfying this and other needs.

SUMMARY OF THE INVENTION

The present invention is directed to a laser diode assembly having a laser diode. The laser diode has an emitting surface and a reflective surface opposing the emitting surface. The laser diode has first and second side surfaces between the emitting and reflective surfaces. A first electrically-insulating heat sink is attached to the first side surface of the laser diode via a first solder bond, and the first heat sink has a first cooling channel. A second electrically-insulating heat sink is attached to the second side surface of the laser diode via a second solder bond, and the second electrically-insulating heat sink has a second cooling channel. A substrate has a top side and a bottom side, and the top side being in communication with a first bottom side of the first electrically-insulating heat sink and a second bottom side of the second electrically-insulating heat sink. The substrate has a flow channel system for passing a coolant to the first cooling channel and the second cooling channel. A metallization layer is attached to the first electrically-insulating heat sink and the second electrically-insulating heat sink. The metallization layer is electrically coupled to the laser diode and conducts electrical current to the laser diode. The metallization layer is isolated from the coolant.

Another aspect of the invention is directed to a laser diode assembly having a laser diode with an emitting surface and a reflective surface opposing the emitting surface. The laser diode has first and second side surfaces between the emitting and reflective surfaces. A first heat sink is attached to the first side surface of the laser diode, and the first heat sink has first multiple components for creating a first cooling channel. A second heat sink is attached to the second side surface of the laser diode, and the second heat sink has second multiple components for creating a second cooling channel. At least one substrate is in communication with the first heat sink and the second heat sink. The at least one substrate has a flow channel system for passing a coolant to the first cooling channel and the second cooling channel. A metallic path is electrically coupled to the laser diode and conducts electrical current to the laser diode.

An additional aspect of the invention is directed to a method of manufacturing a laser diode assembly having a laser diode with an emitting surface and a reflective surface opposing the emitting surface. The laser diode has first and second side surfaces between the emitting and reflective surfaces. A first electrically-insulating heat sink is coupled to the first side surface of the laser diode via a first solder layer. The first heat sink has a first cooling channel. A second electrically-insulating heat sink is coupled to the second side surface of the laser diode via a second solder layer. The second heat sink has a second cooling channel. At least one substrate is coupled to the first electrically-insulating heat sink and the second electrically-insulating heat sink. The substrate(s) has a flow channel system for passing a coolant to the first cooling channel and the second cooling channel. A current path is created that is attached to the first electrically-insulating heat sink and the second electrically-insulating heat sink, and the current path is electrically isolated from the coolant.

The above summary of the present invention is not intended to represent each embodiment or every aspect of the present invention. The detailed description and Figures will describe many of the embodiments and aspects of the present invention.

BRIEF DESCRIPTION OF THE DRAWINGS

The foregoing and other advantages of the invention will become apparent upon reading the following detailed description and upon reference to the drawings.

FIG. 1 illustrates a laser diode assembly in an end view according to an embodiment of the invention.

FIG. 2 illustrates an exploded view of the right channeled heat sink made using diffusion-bonded copper technology according to an embodiment of the invention.

FIG. 3 illustrates an exploded view of the layers of the substrate according to an embodiment of the invention.

FIG. 4 illustrates an exploded perspective view of the assembled laser diode assembly.

Figure 5:
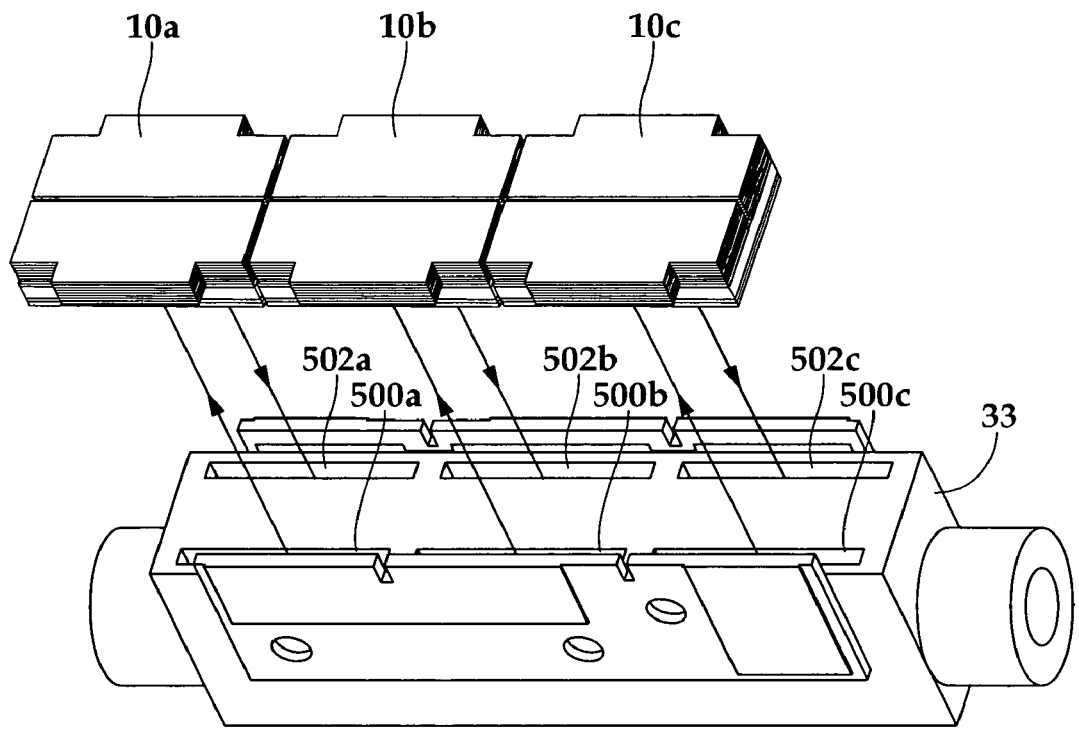
FIG. 5 illustrates the fluid manifold which, in this embodiment, distributes coolant to a set of three laser diode assemblies.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE EMBODIMENTS

FIG. 1 illustrates a laser diode assembly 10 in an end view according to an embodiment of the invention. The laser diode assembly 10 includes a laser diode 12 (sometimes referred to as a "laser diode bar") sandwiched between a left heat sink 14 and a right heat sink 16. The heat sinks 14 and 16 are made of a material that is electrically and thermally conductive, such as copper. Electrical conductivity is needed to conduct the electrical current through the laser diode 12. Thermal conductivity is needed to conduct the intense heat away from the laser diode 12 and maintain the laser diode 12 at a reasonable temperature. The left heat sink 14 is coupled to the laser diode 12 by a solder layer 18. The right heat sink 16 is coupled to the laser diode 12 by another solder layer 19. The solder layers 18 and 19 may be formed of an indium-based solder.

The laser diode 12 has an emitting surface 20 on one end and a reflecting surface 22 opposing the emitting surface 20. The height of the laser diode 12 is defined as the distance between the emitting surface 20 and the reflecting surface 22. The junction of the laser diode 12 where the photons are produced is nearest the right heat sink 16 in the laser diode assembly 10. Electrical power is guided to defined regions of the junction by providing electrically conductive material in the laser diode 12 adjacent those regions and less electrically conductive material outside those regions. Consequently, the laser diode 12 has a plurality of emission points on the emitting surface 20 corresponding to those regions where electrical energy is converted into light energy. When the electrical power is applied, photons propagate though the junction and are reflected off the reflecting surface 22 such that emission only occurs at the emitting surface 20.

A substrate 30 is positioned below the left and right heat sinks 14 and 16 and is held to the left and right heat sinks 14 and 16 by solder layers 24 and 25, respectively. As with solder layers 18 and 19, solder layers 24 and 25 may be formed of an indium-based solder.

The substrate 30 is typically made of a material that has a high thermal conductivity, but a low electrical conductivity, such as beryllium oxide ("BeO"). The substrate 30 includes a metallization layer 32 on both of its top and bottom surfaces. The metallization layer 32 on the lower surface of the substrate 30 is present to allow the entire laser diode assembly 10 to be soldered onto a fluid manifold 33 (see FIG. 5) or a thermal reservoir such as a heat exchanger. The metallization layer 32 on the upper surface of the substrate 30 allows the solder layers 24 and 25 on the left and right heat sinks 14 and 16, respectively, to be attached to the substrate 30. The metallization layer 32 along the upper surface of the substrate 30 is not present in the region directly below the laser diode 12 to electrically isolate the heat sinks 14 and 16 from each other so electrical current is conducted only through the laser diode 12. The metallization layer 32 of the substrate 30 may be formed of a material such as titanium ("Ti"), platinum ("Pt"), or gold ("Au"). The bottom metallization layer 32 is mounted onto the fluid manifold 33.

To create optical energy, electrical current must be conducted through the laser diode 12. When viewing the laser diode assembly 10 from right to left, the electrical current flows from the right heat sink 16, into the laser diode 12, and into the left heat sink 14, as illustrated by the arrow with reference 51 in FIG. 1. There is no electrical path below the laser diode 12 due to a break in the metallization layer 32 directly below the laser diode 12, as discussed above. The electrical current passing through the laser diode 12 produces the optical energy for the laser diode assembly 10.

To ensure that the laser diode assembly 10 operates as efficiently as possibly, an effective heat transfer mechanism is employed. The laser diode assembly 10 includes a coolant channel 40 disposed therein that provides cooling to both sides of the laser diode 12. More specifically, the laser diode assembly 10 includes a coolant channel 40 having an inlet 42 at the bottom of one of the sides of the substrate 30, and a bypass region 45 extending through the substrate 30 and between the left and right heat sinks 14 and 16.

The coolant channel 40 also has an outlet 50 at an opposite side of the bottom of the substrate 30. The coolant channel 40 serves to allow coolant to flow in the direction shown by the arrow with reference 53. The coolant flows from the fluid manifold 33 up into the inlet 42, through the substrate 30 into the right heat sink 16, through a region of the right heat sink 16 near the right side of the laser diode 12, back down into the substrate 30 via the bypass region 45, up into the left heat sink 14 through a region near the left side of the laser diode 12, and then back down through the left side of the substrate 30, out the outlet 50 and back into the fluid manifold 33. The coolant in the coolant channel 40 absorbs heat from the laser diode 12 while allowing the laser diode assembly 10 to retain a compact design. Although only a single coolant channel 40 is shown, the laser diode assembly 10 may include a plurality of different coolant channels 40. The direction of flow of the coolant may also occur in the opposite direction (i.e., entering on the left side of the substrate 30 and exiting on the right side). The coolant flowing through the coolant channel 40 may be deionized water or another non-electrically conductive coolant such as fluroinert.

This transfer of heat from the laser diode assembly 10 to the coolant traveling through the coolant channel 40 allows the laser diode 12 to operate efficiently without breakdown due to overheating. By utilizing channeled right and left heat sinks 16 and 14, the coolant can get as close to the heat source (i.e., the laser diode 12) as in standard macrochannel coolers. However, unlike standard macrochannel coolers, both sides of the laser diode 12 of the present invention are cooled. With this double-sided cooling, the thermal performance of the laser diode 12 is superior to that of the standard macrochannel coolers while retaining compactness.

FIG. 2 illustrates an exploded view of the right channeled heat sink 16 made using diffusion-bonded copper sheets according to an embodiment of the invention. As shown, the right heat sink 16 is formed of a stack of thin copper sheets 202, 205, 210, 215, 220, 225, and 230 that are diffusion-bonded together in multiple layers. The left heat sink 14 may be formed in a similar manner. Each layer is photoetched so that, after diffusion bonding with other layers, the coolant channel 40 is formed that allows coolant to pass through the laser diode assembly 10. Accordingly, by utilizing the coolant channel 40, the coolant is in close proximity to the laser diode 12 (i.e., the heat source), to permit more effective heat transfer. As shown with the arrows in FIG. 2, the coolant travels up through the right heat sink 16 through apertures in the copper sheets forming the coolant channel 40, and then back down through the opposing apertures, which include fin-like structures for more efficient heat transfer.

FIG. 3 illustrates an exploded view of the layers of the substrate 30 according to an embodiment of the invention. As shown, two copper layers 315 and 320 are situated beneath a ceramic layer 310, which in turn, is situated underneath a top copper layer 305. These copper layers are diffusion-bonded to each other, and when in place, the coolant channel 40 is formed. More specifically, when in place, coolant can flow up through the channel 40 on the substrate 30, and then up into the right heat sink 16 located directly above. Although only four layers are shown, other embodiments may utilize more or fewer than four layers of material. The inlet 42 and the outlet 50 are disposed on opposite sides of the bottom copper layer 320. The flow of the coolant through the substrate 30 is illustrated via the arrows shown in FIG. 3. The coolant flows up through layers 315, 310, and 305 and into the right heat sink 16 as described above with respect to FIG. 2. The coolant then flows back down through layers 305, 310, and 315, via the bypass region 45 and then up through layers 315, 310, and 305 and into the left heat sink 14. Finally, the coolant flows back out of the left heat sink 14 and down through layers 305, 310, 315, and 320 where it exits via the outlet 50.

FIG. 4 illustrates an exploded perspective view of the assembled laser diode assembly 10. As illustrated, the substrate 30 has a flow channel system 400. The flow channel system 400 includes the portion of the coolant channel 40 that is disposed therein. More specifically, the flow channel system 400 includes the inlet 42, the bypass region 45, and the outlet 50, and is located directly beneath the opposing left 14 and right 16 heat sinks.

FIG. 5 illustrates the fluid manifold 33 which, in this embodiment, distributes coolant to a set of three laser diode assemblies 10a, 10b, and 10c. As shown, the fluid manifold 33 includes several outlet apertures 500a, 500b, and 500c located beneath the diode assemblies 10a, 10b, and 10c. These outlet apertures 500a, 500b, and 500c line up with the inlets 42 of the coolant channels 40 of the respective laser diode assemblies 10a, 10b, and 10c such that coolant has a path to flow up from the fluid manifold 33 directly into the diode assemblies 10a, 10b, and 10c. After the coolant flows through the respective laser diode assemblies 10a, 10b, and 10c, it flows out of the outlets 50 of the respective coolant channels 40, and back into the fluid manifold 33 via inlet apertures 502a, 502b, and 502c.

The substrates 30 of each of the diode assemblies 10a, 10b, and 10c may be soldered onto the top of the fluid manifold 33. The metallization layer 32 located on the bottom of each of the substrates 30 (see FIG. 1) provides an adequate surface for soldering. It should be noted that the top of the fluid manifold 33 could be configured like the non-conductive substrate 30 so that the left and right heat sinks 14 and 16, respectively, could be attached thereto, eliminating the need for the substrate 30.

In the embodiment of FIGS. 1-5, the coolant channel 40 in the left and right heat sinks 14 and 16 allows the coolant to get very close to both sides of the laser diode 12, thereby providing efficient heat transfer. With the double-sided cooling, the thermal performance of this laser diode assembly 10 is superior to that of standard macrochannel coolers while retaining compactness. However, because the coolant flow path 53 and the electrical current flow path 51 overlap, the coolant must be non-electrically conductive (e.g., deionized water, or fluroinert may be utilized).

Figure 6:
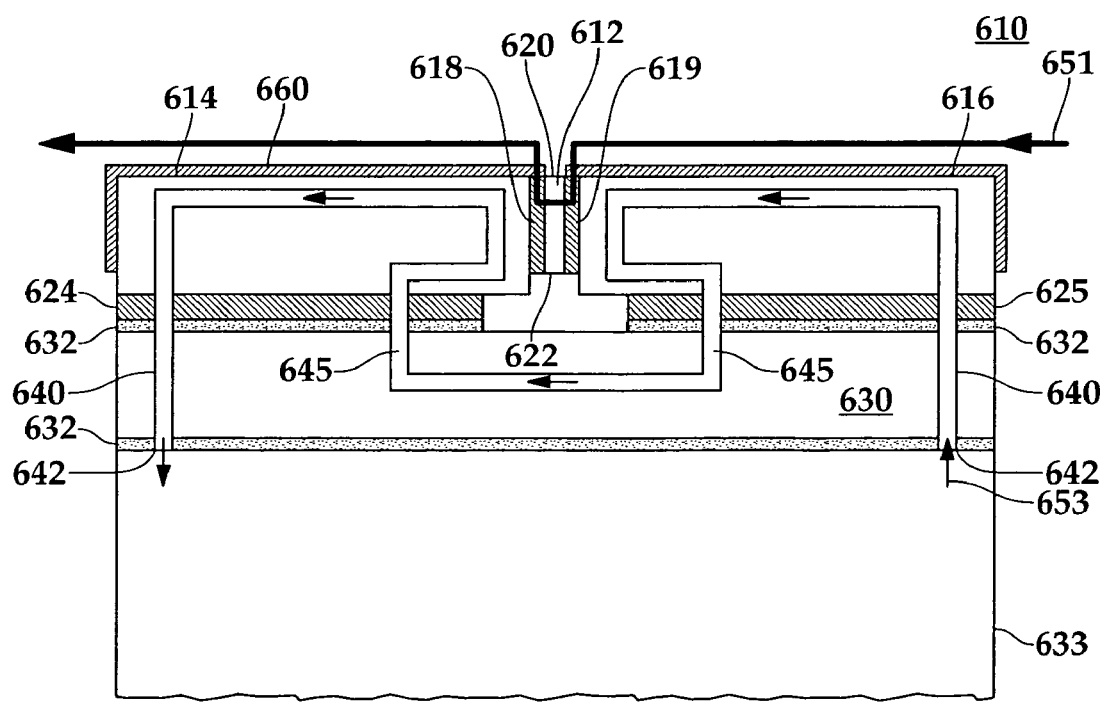
FIG. 6 illustrates an alternative embodiment of the invention where the electrical current path and the coolant flow path of a laser diode assembly are decoupled.

FIG. 6 illustrates an alternative embodiment of the invention where the electrical current path 651 and the coolant flow path 653 of a laser diode assembly 610 are decoupled. As shown, the electrical current path 651 and the coolant flow path 653 are separated (i.e., they do not overlap). A laser diode 612 is positioned between a left heat sink 614 and a right heat sink 616 by solder layers 618 and 619, respectively. The solder layers 618 and 619 may be formed of an indium-based solder. The laser diode 612 has a reflecting surface 622 and an emitting surface 620. The heat sinks 614 and 616 are formed of a thermally conductive, but electrically insulating material such as silicon, PEEK™ (Polyetheretherketone), diamond, BeO, or injection-molded ceramic or plastic. The left heat sink 614 and right heat sink 616 may be formed of sheets of diffusion-bonded silicon in a manner similar to that described above with respect to the diffusion-bonded copper sheets of FIG. 3.

A substrate 630 is positioned below the left and right heat sinks 614 and 616 and is held to the left and right heat sinks 614 and 616 by solder layers 624 and 625, respectively. As with solder layers 618 and 619, solder layers 624 and 625 may be formed of an indium-based solder. As shown, neither solder layers 618 nor 624 are located in a region around the lower right-hander corner of the left heat sink 614. The lack of solder in this region serves to electrically isolate solder layer 618 from solder layer 624. Similarly, solder layers 619 and 625 are electrically isolated from each other because neither solder layers 619 nor 625 are located in a region around the lower left-hander corner of the right heat sink 616.

As with the substrate 30 of the embodiment described above with respect to FIGS. 1-5, the substrate 630 may be made of a material that has a high thermal conductivity, but a low electrical conductivity, such as BeO. The substrate 630 includes a metallization layer 632 on both of its top and bottom surfaces. The metallization layer 632 on the lower surface of the substrate 630 is present to allow the entire laser diode assembly 610 to be soldered to a fluid manifold 633 or a thermal reservoir such as a heat exchanger. The metallization layer 632 on the upper surface of the substrate 630 allows the solder layers 624 and 625 on the left and right heat sinks 614 and 616, respectively, to be attached to the substrate 630. The metallization layer 632 along the upper surface of the substrate 630 is not present in the region directly below the laser diode 612 to electrically isolate the heat sinks 614 and 616 from each other so electrical current is conducted only through the laser diode 612. The metallization layer 632 of the substrate 630 may be formed of a material such as titanium ("Ti"), platinum ("Pt"), or gold ("Au"). The bottom metallization layer 632 is mounted onto the fluid manifold 633.

A coolant channel 640 extends through the laser diode assembly 610. This coolant channel 640 is similar to the coolant channel 40 of the first embodiment shown in FIG. 1. This coolant channel 640 has an inlet 642 to receive the coolant into the substrate 630, and extends up into the right heat sink 616. The coolant channel 640 extends back down from the right heat sink 616, into the substrate in a bypass region 645, and then over into the left heat sink 614, and finally back down into the substrate 630 and out to the fluid manifold 633 via an outlet 650.

As shown, the laser diode assembly 610 has a metallization layer 660 attached to the left and right heat sinks 614 and 616. The metallization layer 660 may be disposed on top of the left and right heat sinks 614 and 616 or could also be attached such that it is imbedded in the left and right heat sinks 614 and 616. This metallization layer 660 is utilized to supply the electric current to the laser diode 612. Because the left and right heat sinks are formed of electrically insulating silicon, the metallization layer 660 is necessary to supply the electric current necessary to operate the laser diode 612. Also, because the left and right heat sinks 614 and 616 are formed of the insulating silicon, the coolant and electric current flow paths 653 and 651, respectively, do not intersect or overlap. Consequently, there is no overlap of the electrical current path 651 and the coolant flow path 652. Therefore, there is no requirement that non-electrically conductive coolant (such as deionized water or fluroinert) be utilized as the coolant flowing through the coolant channel 640. The substrate 630 may also be a metal (e.g., copper) in a modification to this embodiment because the left and right silicon heat sinks 614 and 616 insulate the electrical current. Also, if the substrate 630 is made of copper, then the metallization layer 632 is not required, and may be omitted. The metallization layer 660

Figure 7:
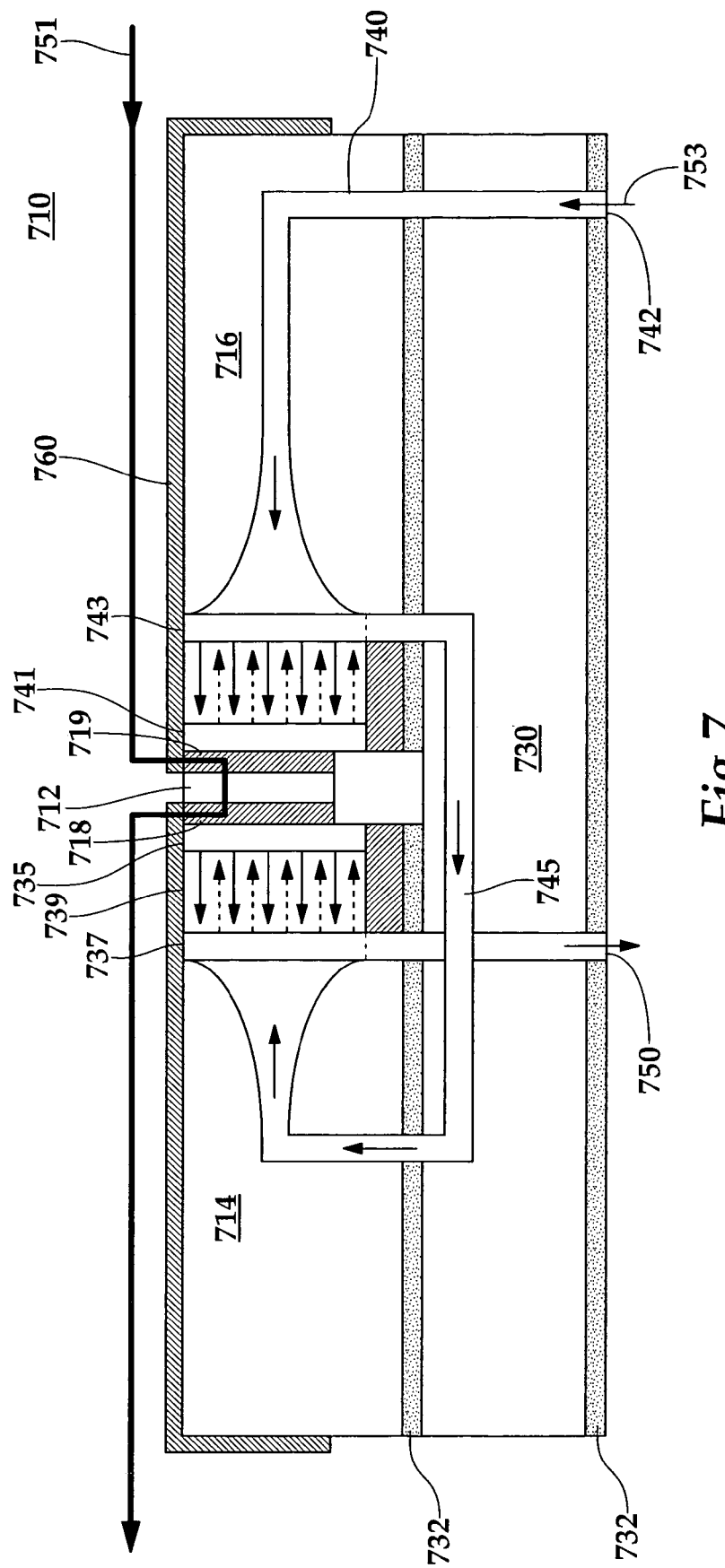
FIG. 7 illustrates an additional embodiment of the invention in which a cooling channel is coupled to impingement coolers and circulates coolant that removes heat from diamond layers of a laser diode assembly.

FIG. 7 illustrates an additional embodiment of the invention in which a cooling channel 740 is coupled to impingement coolers 737 and 743 and circulates coolant that removes heat from diamond layers 735 and 741 of a laser diode assembly 710. As shown, the laser diode assembly 710 includes a right heat sink 716 and a left heat sink 714. These heat sinks 716 and 714 may each be formed of PEEK™, silicon, diamond, BeO, or other injection-molded plastic or ceramic. A laser diode 712 is coupled to the left heat sink 714 by solder layer 718, and to the right heat sink 716 by solder layer 719. A substrate 730 is positioned at the bottom of the laser diode assembly 710, and is coupled to the left and right heat sinks 714 and 716 by an adhesive or a solder/metallization layer 732. The diamond layer 735 is located within the left heat sink 714 and is positioned in close proximity to the laser diode 712. The diamond layer 735 may be flush with the solder layer 718 in some variations of this embodiment. The diamond layer 735 is utilized because diamond has a high conductivity, but low electrical conductivity and therefore transfers heat from the laser diode 12 to the impingement cooling region without adversely affecting its performance.

The left heat sink 714 also includes an impingement cooler 737 that circulates the coolant from the coolant channel 740 to the diamond layer 735, where heat is absorbed. The impingement cooler 737 receives the coolant from the coolant channel 740, and directs the coolant into a channeled structure 739. The channeled structure 739 may be formed of nickel. The channeled structure 739 is akin to a nozzle and has a honeycomb-like arrangement of a plurality of holes through which the coolant can flow until it reaches the exposed surface of the diamond layer 735. The channeled structure 739 also has return holes through which the coolant returns, in a direction away from the diamond layer 735, toward the impingement cooler 737. On its return, the coolant flows downwardly out of the impingement cooler 737, back down into the substrate 730, and out to a coolant manifold or heat exchanger connected thereto. The right heat sink 716 has the diamond layer 741 that is in close proximity to the laser diode 712. The right heat sink 716 has its own impingement cooler 743 and channeled structure 744. A metallization layer 760 is located on an exterior surface of the right and left heat sinks 716 and 714. Electric current flows to the laser diode 712 through the metallization layer 760 in the direction of arrow 751.

During the cooling process, coolant flows into the inlet 742 up into the coolant channel 740 in the coolant flow direct indicated by the arrows shown with reference 753. the coolant flows up into the right heat sink 716, then through the impingement cooler 743, the channeled structure 744, and against the diamond layer 741. The coolant then returns through the channeled structure 744, and downward from the impingement cooler 743, and back into the substrate 730 in a bypass region 745. Next, the coolant flows up through the left heat sink 714, and through the impingement cooler 737, the channeled structure 739, and against the diamond layer 735. Finally, the coolant returns through the channeled structure 739 and then flows down through the substrate and out an outlet 750 and into the coolant manifold or heat exchanger connected thereto. The coolant may be water. The electric current flowing through the metallization layer 760 is electrically isolated from the coolant channel 740.

Although the embodiment shown in FIG. 7 has diamond layers 735 and 741, other suitable materials such as BeO may be used instead of diamond. Also, the substrate 730 may be formed of a number of suitable materials such as copper or BeO. International Mezzo Technologies, located in Baton Rouge, La., manufactures an impingement cooler which would be suitable for impingement coolers 737 and 743 of the embodiment shown in FIG. 7.

In addition to the impingement region described above that carries heat away, heat transfer could also be performed by an evaporative spray cooler, such as those manufactured by Rini Technologies™.

The various embodiments described above all describe coolant channels that move coolant in a path up from a coolant manifold or heat exchanger into a substrate, up through a right heat sink, back down into the substrate again via a bypass region, and then through the left heat sink and back down through the substrate and to the coolant manifold or heat exchanger. This is known as a serial path—i.e., there is one path in which the coolant flows throughout the laser diode assembly. However, it should be appreciated that parallel coolant paths may also be utilized. In other words, there may be separate coolant channels for the left and right sinks. For example, a first coolant channel may extend from the coolant manifold up through the substrate, throughout the right heat sink, and then back down through the substrate so the heated coolant can return to the coolant manifold or heat exchanger. A second coolant channel would extend from the coolant manifold up through the substrate, through the left manifold, and then back down thought the substrate again so that the heated coolant can return to the coolant manifold or heat exchanger. This arrangement is known as a parallel path because the coolant traveling to each heat sink has to go through different paths.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A laser diode assembly, comprising:
    a laser diode having an emitting surface and a reflective surface opposing the emitting surface, the laser diode having first and second side surfaces between the emitting and reflective surfaces;
    a first electrically-insulating heat sink attached to the first side surface of the laser diode via a first solder bond, the first heat sink having a first cooling channel;
    a second electrically-insulating heat sink attached to the second side surface of the laser diode via a second solder bond, the second electrically-insulating heat sink having a second cooling channel;
    a substrate having a top side and a bottom side, the top side being in communication with a first bottom side of the first electrically-insulating heat sink and a second bottom side of the second electrically-insulating heat sink, the substrate having a flow channel system for passing a coolant to the first cooling channel and the second cooling channel; and
    a metallization layer attached to the first electrically-insulating heat sink and the second electrically-insulating heat sink, the metallization layer being electrically coupled to the laser diode and conducting electrical current to the laser diode, the metallization layer being isolated from the coolant.

2. The laser diode assembly of claim 1, further including a fluid manifold in communication with the substrate, the fluid manifold distributing the coolant to the substrate.

3. The laser diode assembly of claim 1, wherein the first electrically-insulating heat sink and the second electrically-insulating heat sink are formed of electrically-insulating silicon blocks.

4. The laser diode assembly of claim 3, wherein the electrically-insulating silicon blocks are formed of bonded layers of silicon.

5. The laser diode assembly of claim 1, wherein the coolant is water.

6. The laser diode assembly of claim 1, wherein the flow channel system has an inlet, an outlet, and a bypass region, the inlet providing the coolant to the first electrically-insulating heat sink, the bypass region passing the coolant from the first electrically-insulating heat sink to the second electrically-insulating heat sink, and the outlet receiving the coolant from the second electrically-insulating heat sink.

7. The laser diode assembly of claim 6, wherein the substrate is made of a plurality of layers that are fused together to create the bypass region.

8. The laser diode assembly of claim 1, wherein at least one of the first and second electrically-insulating heat sinks includes an impingement region causing the coolant to impinge against a wall that is near the one of the side surfaces of the laser diode.

9. The laser diode assembly of claim 8, wherein the impingement region includes an impingement nozzle providing a plurality of streams of the coolant against the wall, the at least one of the first and second electrically-insulating heat sinks being made of a material and the impingement nozzle being made of a metal encased in the material.

10. The laser diode assembly of claim 9, wherein the wall is a side surface of a thermally conductive structure at least partially encased in the material, the material being polymeric.

11. The laser diode assembly of claim 1, wherein the metallization layer is located on an exterior surface of the first and second electrically-insulative heat sinks.

12. A laser diode assembly, comprising:
    a laser diode having an emitting surface and a reflective surface opposing the emitting surface, the laser diode having first and second side surfaces between the emitting and reflective surfaces;
    a first heat sink attached to the first side surface of the laser diode, the first heat sink having a first set of multiple components for creating a first cooling channel, the first heat sink being created by bonding a first plurality of layers of material, the first plurality of layers being the first set of multiple components;

a second heat sink attached to the second side surface of the laser diode, the second heat sink having a second set of multiple components for creating a second cooling channel, the second heat sink being created by bonding a second plurality of layers of material, the second plurality of layers being the second set of multiple components;

at least one substrate being in communication with the first heat sink and the second heat sink, wherein the at least one substrate has a flow channel system for passing a coolant to the first cooling channel and the second cooling channel;

a metallic path being electrically coupled to the laser diode and conducting electrical current to the laser diode; and wherein the first plurality of layers and the second plurality of layers are copper sheets and the metallic oath is provided by the copper sheets.

13. The laser diode assembly according to claim 12, wherein the at least one substrate includes one substrate, and the flow channel system includes a bypass region, an inlet, and an outlet, the inlet providing the coolant to the first heat sink, the bypass region passing the coolant from the first heat sink to the second heat sink, the outlet receiving the coolant from the second heat sink.

14. The laser diode assembly according to claim 12, wherein the coolant is deionized water.

15. The laser diode assembly according to claim 12, wherein at least the first heat sink includes an impingement region causing the coolant to impinge against a wall that is near the first side surface of the laser diode, the first set of multiple components including a base structure and an impingement nozzle encased within the base structure.

16. A method of manufacturing a laser diode assembly having a laser diode with an emitting surface and a reflective surface opposing the emitting surface, the laser diode having first and second side surfaces between the emitting and reflective surfaces, comprising:

coupling a first electrically-insulating heat sink to the first side surface of the laser diode via a first solder layer, the first heat sink having a first cooling channel;

coupling a second electrically-insulating heat sink to the second side surface of the laser diode via a second solder layer, the second heat sink having a second cooling channel;

coupling at least one substrate to the first electrically-insulating heat sink and the second electrically-insulating heat sink, the at least one substrate having a flow channel system for passing a coolant to the first cooling channel and the second cooling channel; and creating a current path that is attached to the first electrically-insulating heat sink and the second electrically-insulating heat sink, the current path being electrically isolated from the coolant and providing current to the laser diode.

17. The method of claim 16, wherein the creating includes applying a metallization layer to the first electrically-insulating heat sink and the second electrically-insulating heat sink.

18. The method of claim 16, further including forming the first electrically-insulating heat sink and the second electrically-insulating heat sink from a plurality of bonded layers.

19. The method of claim 16, wherein at least one of the first and second electrically-insulating heat sinks includes an impingement region causing the coolant to impinge against a wall that is near the one of the side surfaces of the laser diode.

20. The method of claim 19, wherein the impingement region includes an impingement nozzle providing a plurality of streams of the coolant against the wall, the at least one of the first and second electrically-insulating heat sinks being made of a polymeric material and the impingement nozzle being made of a metal encased in the polymeric material.

21. The method of claim 16, wherein the first and second solder layers are the same material.

22. The method of claim 16, wherein the coupling the at least one substrate to the first and the second electrically-insulating heat sinks includes soldering involving a third solder layer, the third solder layer being material that is different from the first and second solder layers.

23. A laser diode assembly, comprising:

a laser diode having an emitting surface and a reflective surface opposing the emitting surface, the laser diode having first and second side surfaces between the emitting and reflective surfaces;

a first heat sink attached to the first side surface of the laser diode, the first heat sink having a first set of multiple components for creating a first cooling channel, the first heat sink being created by bonding a first plurality of silicon layers, the first plurality of silicon layers being the first set of multiple components;

a second heat sink attached to the second side surface of the laser diode, the second heat sink having a second set of multiple components for creating a second cooling channel, the second heat sink being created by bonding a second plurality of silicon layers, the second plurality of silicon layers being the second set of multiple components;

at least one substrate being in communication with the first heat sink and the second heat sink, wherein the at least one substrate has a flow channel system for passing a coolant to the first cooling channel and the second cooling channel;

a metallic path being electrically coupled to the laser diode and conducting electrical current to the laser diode, the metallic path being provided by a metallization layer on the first and second heat sinks.

24. The laser diode assembly according to claim 23, wherein the at least one substrate includes one substrate, and the flow channel system includes a bypass region, an inlet, and an outlet, the inlet providing the coolant to the first heat sink, the bypass region passing the coolant from the first heat sink to the second heat sink, the outlet receiving the coolant from the second heat sink.

25. The laser diode assembly according to claim 23, wherein at least the first heat sink includes an impingement region causing the coolant to impinge against a wall that is near the first side surface of the laser diode, the first set of multiple components including a base structure and an impingement nozzle encased within the base structure.

* * * * *

UNITED STATES PATENT AND TRADEMARK OFFICE
CERTIFICATE OF CORRECTION

PATENT NO. : 7,305,016 B2  
APPLICATION NO. : 11/077466  
DATED : December 4, 2007  
INVENTOR(S) : Edward Franklin Stephens, IV Page 1 of 1

It is certified that error appears in the above-identified patent and that said Letters Patent is hereby corrected as shown below:

Column 11, Claim 12, Line 19  
Delete the word oath and insert the word -- path --

Signed and Sealed this

Tenth Day of June, 2008

JON W. DUDAS  
*Director of the United States Patent and Trademark Office*